(12) United States Patent
Fu et al.

(10) Patent No.: US 12,342,498 B2
(45) Date of Patent: Jun. 24, 2025

(54) DYNAMIC WALL HEAT EXCHANGE DEVICE BASED ON PIEZOELECTRIC EXCITATION

(71) Applicant: HANGZHOU CITY UNIVERSITY, Hangzhou (CN)

(72) Inventors: Jiahong Fu, Hangzhou (CN); Qianwei Hu, Hangzhou (CN); Xu Miao, Hangzhou (CN); Zhecheng Hu, Hangzhou (CN); Weiguo Zhu, Hangzhou (CN); Jia Yao, Hangzhou (CN)

(73) Assignee: HANGZHOU CITY UNIVERSITY, Hangzhou (CN)

( * ) Notice: Subject to any disclaimer, the term of this patent is extended or adjusted under 35 U.S.C. 154(b) by 350 days.

(21) Appl. No.: 18/185,356

(22) Filed: Mar. 16, 2023

(65) Prior Publication Data

US 2023/0320030 A1 Oct. 5, 2023

(30) Foreign Application Priority Data

Apr. 2, 2022 (CN) ......................... 202210340423.2

(51) Int. Cl.
*H05K 7/20* (2006.01)
*F28F 13/10* (2006.01)

(52) U.S. Cl.
CPC ..... *H05K 7/20263* (2013.01); *H05K 7/20272* (2013.01); *F28F 13/10* (2013.01)

(58) Field of Classification Search
CPC ........... H05K 7/20872; H05K 7/20263; H05K 7/20145; H05K 7/202; H05K 7/20272; F28F 13/10; F28F 13/12; H10N 30/30; H10N 30/304; H10N 30/88; H10N 30/886; F28G 7/00; B06B 1/06; H02N 2/02; H02N 2/006; H02N 2/185
See application file for complete search history.

(56) References Cited

U.S. PATENT DOCUMENTS

2021/0289657 A1* 9/2021 Chiang ............. H05K 7/20218

* cited by examiner

*Primary Examiner* — Len Tran
*Assistant Examiner* — Kamran Tavakoldavani

(57) ABSTRACT

Disclosed is a dynamic wall heat exchange device based on piezoelectric excitation, comprising a base support. A sidewall of the base support is provided with a strip-shaped opening, and a low-temperature heat source runner is arranged in the strip-shaped opening. The base support is further provided with a high-temperature heat source runner. The high-temperature heat source runner comprises a main pipe erected on the base support. The main pipe is sleeved with a heat exchange sleeve, and corrugated pipes are connected to the main pipe in series. The low-temperature heat source runner also penetrates through the heat exchange sleeve. The base support is provided with a plurality of elastic cantilever arms, the lower ends of each of the elastic cantilever arms is provided with an inertial mass block, and a piezoelectric stack is arranged between the elastic cantilever arm and the inertial mass block.

18 Claims, 4 Drawing Sheets

DYNAMIC WALL HEAT EXCHANGE DEVICE BASED ON PIEZOELECTRIC EXCITATION

CROSS-REFERENCE TO RELATED APPLICATION

This patent application claims the benefit and priority of Chinese Patent Application No. 202210340423.2, filed with the China National Intellectual Property Administration on Apr. 2, 2022, the disclosure of which is incorporated by reference herein in its entirety as part of the present application.

TECHNICAL FIELD

The present disclosure relates to the field of thermal management, in particular relates to a dynamic wall heat exchange device based on piezoelectric excitation.

BACKGROUND

Modern vehicles are showing the distinctive development trend of electrification, informatization and intelligence. There are more and more high-power electric electronic control units and distributed arithmetic units showing the technical characteristics of various heat source components, large quantity, scattered layout, high heat flux density, and large temperature difference span. Therefore, an efficient, rapid and layout-friendly thermal management scheme is urgently needed.

At present, the known dynamic wall heat exchange device cannot be widely used in micro high heat flux equipment such as chips and lasers due to its large volume. Therefore, it is necessary to design a heat exchange device to solve the above problems.

SUMMARY

An objective of the present disclosure is to provide a dynamic wall heat exchange surface based on piezoelectric excitation. In accordance with the present disclosure, the staying time of a fluid in the heat exchange sleeve can be prolonged, and the heat exchange efficiency is improved. In addition, the device has the advantage of small volume, thus satisfying the heat exchange enhancement requirements of micro high heat flux equipment.

The technical solution of the present disclosure is as follows: a dynamic wall heat exchange device based on piezoelectric excitation comprises a base support. A sidewall of the base support is provided with a strip-shaped opening, and a low-temperature heat source runner is arranged in the strip-shaped opening. The base support is further provided with a high-temperature heat source runner, and the high-temperature heat source runner comprises a main pipe erected on the base support. The main pipe is sleeved with a heat exchange sleeve, and corrugated pipes are connected to the main pipe in series and are arranged on both sides of the heat exchange sleeve. The low-temperature heat source runner also penetrates through the heat exchange sleeve.

The base support is provided with a plurality of elastic cantilever arms, the lower end of each of the elastic cantilever arms is provided with an inertial mass block, and a piezoelectric stack is arranged between the elastic cantilever arm and the inertial mass block. The lower portion of the inertial mass block is provided with an exciting element, and the exciting element is arranged above the corrugated pipe. External voltages are applied to the piezoelectric stacks to enable the piezoelectric stacks to generate excited vibrations. The piezoelectric stacks drive the exciting elements to vibrate, the exciting force is transferred by the exciting elements to the corrugated pipe of the main pipe to enable the walls of the corrugated pipes to vibrate. The corrugated pipes may generate tiny deformation during vibration, thus enabling a fluid between the corrugated pipes to stay longer in the heat exchange sleeve to achieve sufficient heat exchange of the heat in the heat exchange sleeve.

In the above dynamic wall heat exchange device based on piezoelectric excitation, the elastic cantilever arm is provided with a preload bolt in a penetrating manner. The upper end of the preload bolt is provided with a preload flat-head knurled nut, and the upper side of the elastic cantilever arm is connected to the preload flat-head knurled nut by a preload spring.

In the above dynamic wall heat exchange device based on piezoelectric excitation, each of the exciting elements is connected to the inertial mass block by a fixing bolt, the lower end of the exciting element is provided with a skewed tooth, and the skewed tooth of the exciting element is in contact with the corrugated pipe. When the exciting elements vibrate, the corrugated pipes are compressed by the skewed teeth to drive the corrugated pipes to crawl back and forth, further increasing the staying time of the fluid between the corrugated pipes in the heat exchange sleeve.

In the above dynamic wall heat exchange device based on piezoelectric excitation, the heat exchange sleeve is formed by three types of materials with different controllable heat-conducting coefficients from top to bottom.

In the above dynamic wall heat exchange device based on piezoelectric excitation, the number of the low-temperature heat source runners is two, and both sides of each of the low-temperature heat source runners are connected to the inner walls of the strip-shaped openings by vibrating reeds. The high-temperature heat source runner is perpendicular to the low-temperature heat source runners.

In the above dynamic wall heat exchange device based on piezoelectric excitation, a preload flat-head knurled nut is threaded to the upper end of the preload bolt, and a preload spring is arranged between the preload flat-head knurled nut and the elastic cantilever arm.

In the above dynamic wall heat exchange device based on piezoelectric excitation, both sides of the base support are provided with runner holders in a penetrating manner. The runner holders each comprise a platy portion connected to the base support, and the surface of the platy portion is provided with a tubular portion. The two ends of the high-temperature heat source runner respectively penetrate through the two tubular portions.

In the above dynamic wall heat exchange device based on piezoelectric excitation, the base support is provided with a plurality of mounting holes. The cross section of the elastic cantilever arm is of an L-shaped structure, and the elastic cantilever arm is provided with a fixing hole corresponding to the mounting hole.

In the above dynamic wall heat exchange device based on piezoelectric excitation, the piezoelectric stack is formed by stacking a plurality of circular piezoelectric plates.

In the above dynamic wall heat exchange device based on piezoelectric excitation, the inertial mass block is internally provided with a hexagon bolt countersink, and a cap nut of the preload bolt is located in the hexagon bolt countersink. The upper surface of the inertial mass block is provided with a piezoelectric stack countersink, the piezoelectric stack countersink communicates with the hexagon bolt countersink by a connecting hole, and the lower end of the piezoelectric stack is located in the piezoelectric stack countersink.

In the above dynamic wall heat exchange device based on piezoelectric excitation, the bottom of the base support is provided with a heat dissipation port.

Compared with the prior art, the present disclosure has the following beneficial effects:

1. In the present disclosure, a base support is provided with a plurality of elastic cantilever arms, the lower end of each of the elastic cantilever arms is provided with an inertial mass block, and a piezoelectric stack is arranged between the elastic cantilever arm and the inertial mass block. The lower portion of the inertial mass block is provided with an exciting element, and the exciting element is arranged above a corrugated pipe. Sinusoidal excitation voltages with different frequencies and amplitudes are applied to the piezoelectric stacks to make the piezoelectric stacks generate different excited vibrations, thus driving the inertial mass blocks to vibrate up and down. The inertial mass blocks are configured to apply exciting force to the corrugated pipes by the exciting elements, and the corrugated pipes may generate tiny deformation under the repeated compression of the lower inclined planes of the exciting elements, thus making a fluid between the corrugated pipes stay in a heat exchange sleeve for a longer time and achieving sufficient heat exchange of the heat in the heat exchange sleeve. In addition, when the corrugated pipes vibrate, the main pipe vibrates accordingly to drive the heat exchange sleeve to vibrate, thus promoting the molecular resonance of the fluid in the heat exchange sleeve and enhancing heat exchange. Moreover, the device has high integration and small overall volume, thus satisfying the heat exchange enhancement requirements of micro high heat flux equipment.

2. In the present disclosure, the lower end of the exciting element is provided with a skewed tooth, and the skewed tooth of the exciting element is in contact with the corrugated pipe. During the vibration of the exciting element, the corrugated pipe is compressed by the skewed tooth to drive the corrugated pipe to crawl back and forth to further improve the staying time of the fluid between the corrugated pipes in the heat exchange sleeve, thus improving the heat exchange effect between the fluids in the heat exchange sleeve.

3. In the present disclosure, both sides of the base support are provided with runner holders, the runner holders each comprise a platy portion connected to the base support, and the surface of the platy portion is provided with a tubular portion. The two ends of the high-temperature heat source runner penetrate through the two tubular portions, respectively. The runner holders are provided to limit the high-temperature heat source main runner, thus preventing the high-temperature heat source runner from excessive slippage.

4. The inertial mass block is provided with a preload bolt, the upper end of the preload bolt is provided with a preload flat-head knurled nut, and a preload spring is arranged between the preload flat-head knurled nut and the elastic cantilever arm. Through the above structure, the preload pressure can be regulated to be greater than the maximum output force of an excitation system, thus guaranteeing that the piezoelectric stack and the whole device operate normally without being damaged.

Figure 1:
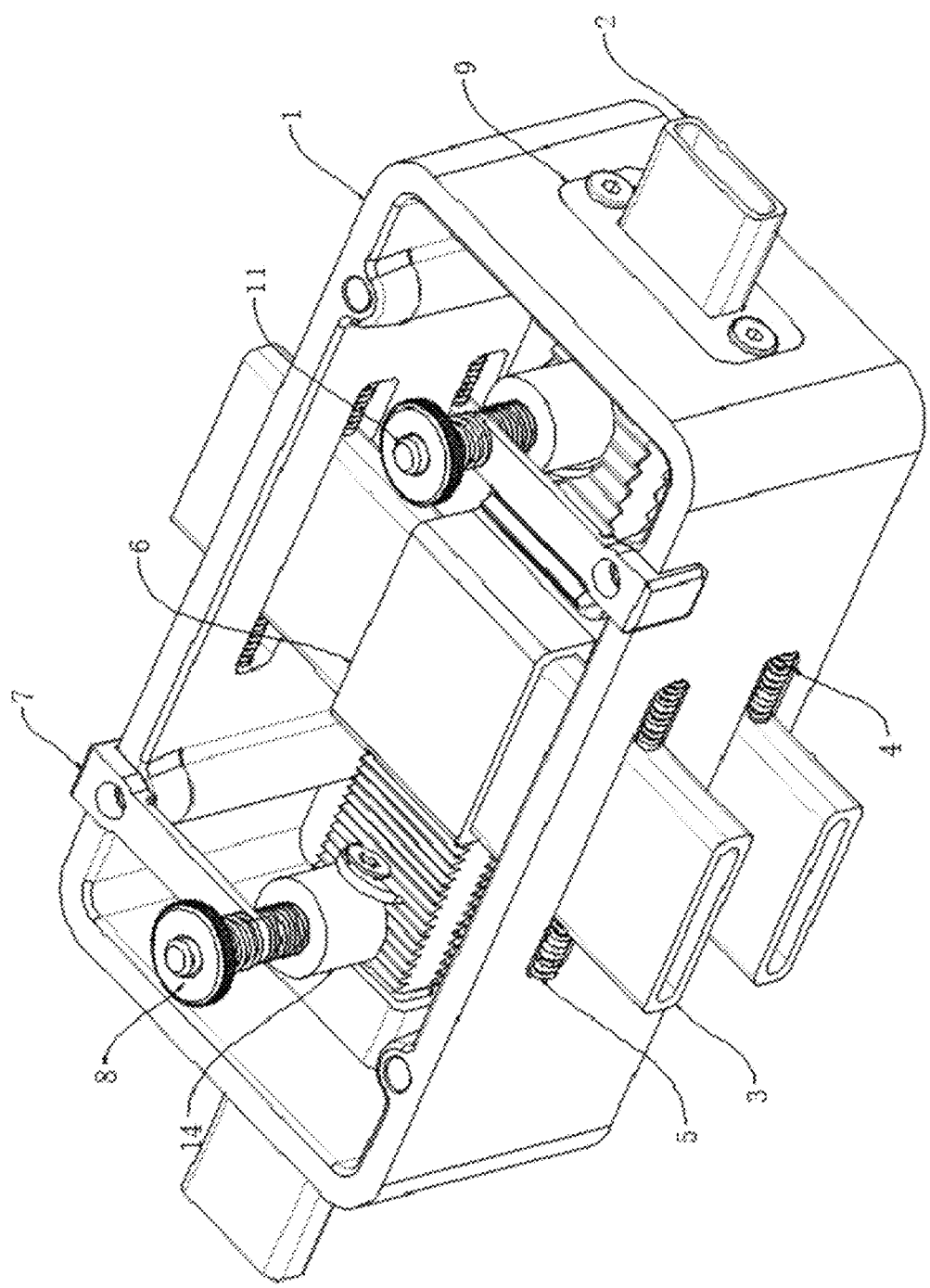
FIG. 1 is a schematic diagram of a structure in accordance with the present disclosure.
Figure 2:
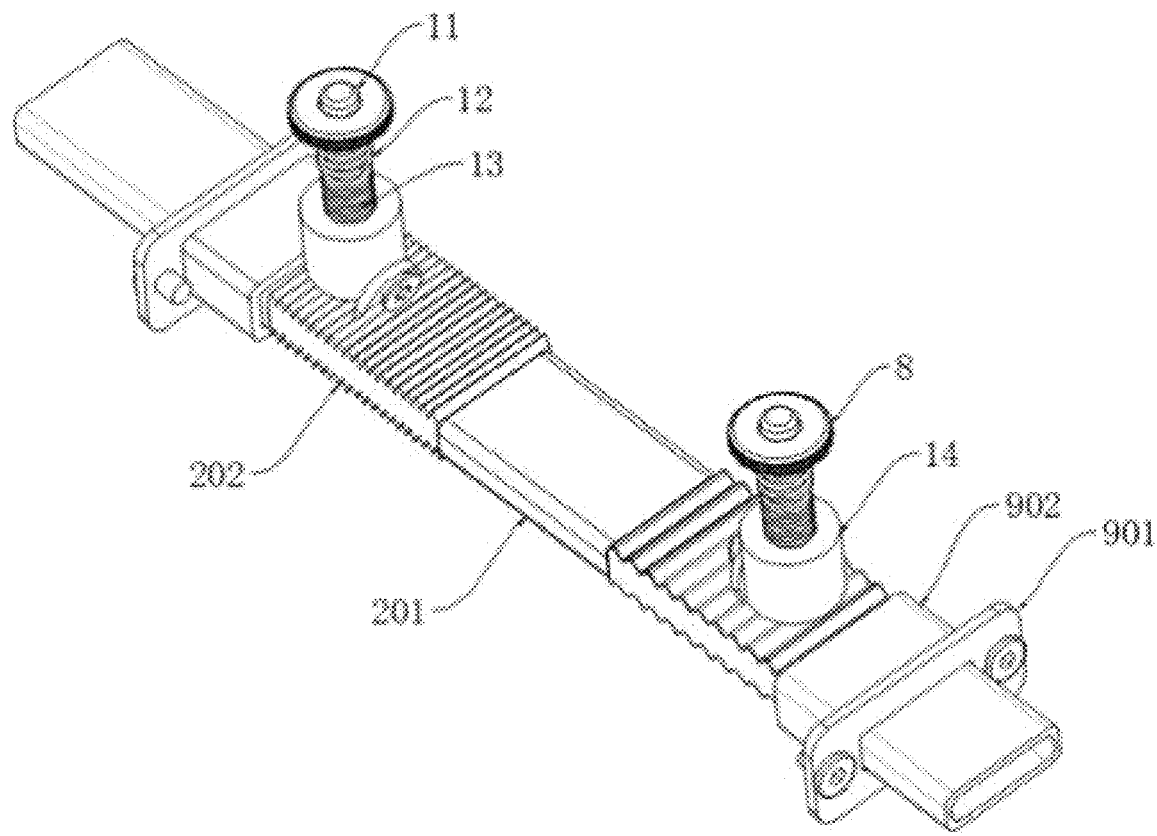
FIG. 2 is an assembly diagram of a high-temperature heat source runner and an exciting element in accordance with the present disclosure.
Figure 3:
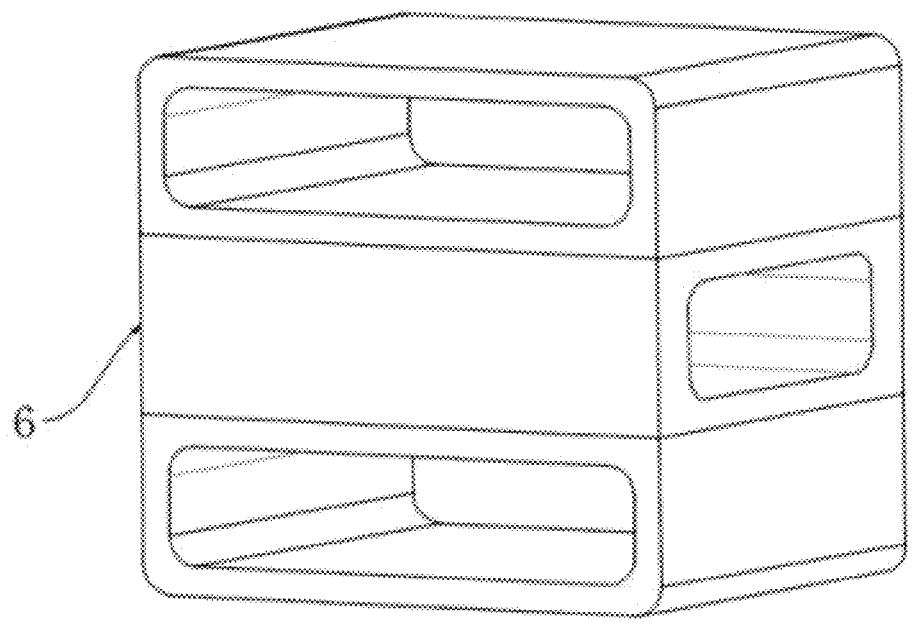
FIG. 3 is a schematic diagram of a structure of a heat exchange sleeve in accordance with the present disclosure.
Figure 4:
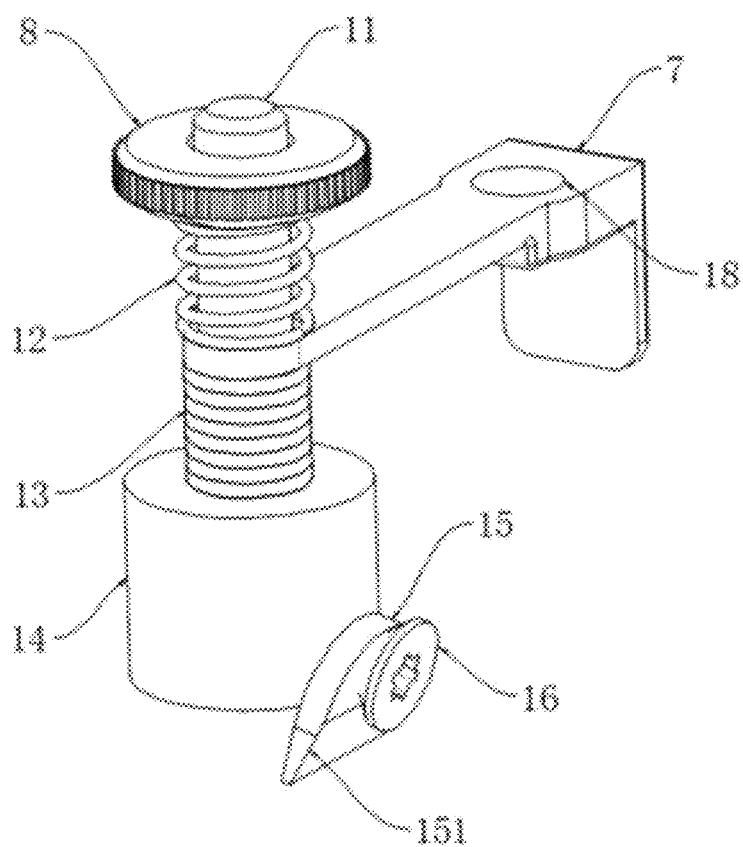
FIG. 4 is an assembly diagram of an inertial mass block and an elastic cantilever arm in accordance with the present disclosure.
Figure 5:
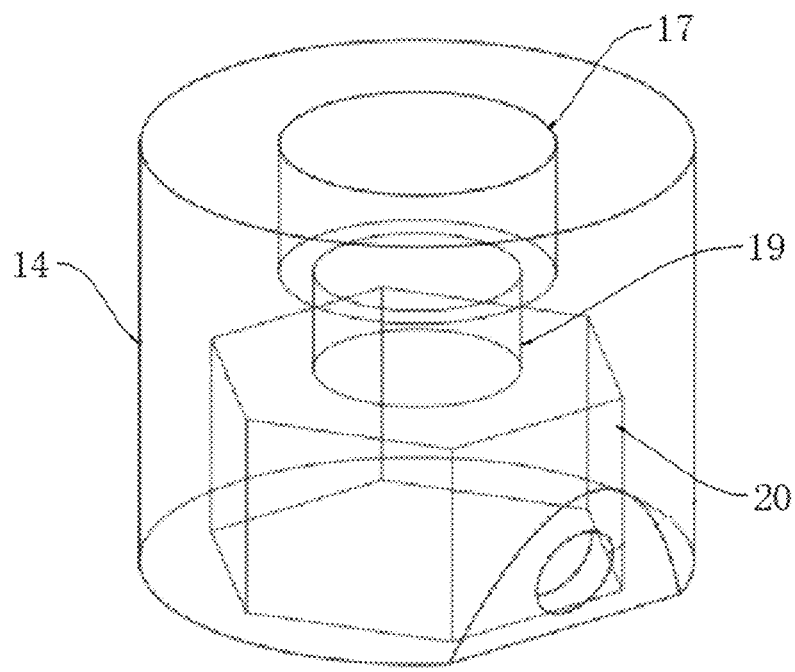
FIG. 5 is a schematic diagram of an internal structure of an inertial mass block in accordance with the present disclosure.

In the drawings: 1—base support; 2—high—temperature heat source runner; 201—main pipe; 202—corrugated pipe; 3—low-temperature heat source runner; 4—strip-shaped opening; 5—vibrating reed; 6—heat exchange sleeve; 7—elastic cantilever arm; 8—preload flat-head knurled nut; 9—runner holder; 901—platy portion; 902—tubular portion; 10—mounting hole; 11—preload bolt; 12—preload spring; 13—piezoelectric stack; 14—inertial mass block; 15—exciting element; 151—skewed tooth; 16—fixing bolt; 17—piezoelectric stack countersink; 18—fixing hole; 19—connecting hole; 20—hexagon bolt countersink; 21—heat dissipation port.

DETAILED DESCRIPTION OF THE EMBODIMENTS

The following is a further description of the present disclosure with reference to the accompanying drawings and embodiments, but is not intended to be a basis for limiting the present disclosure.

Figure 6:
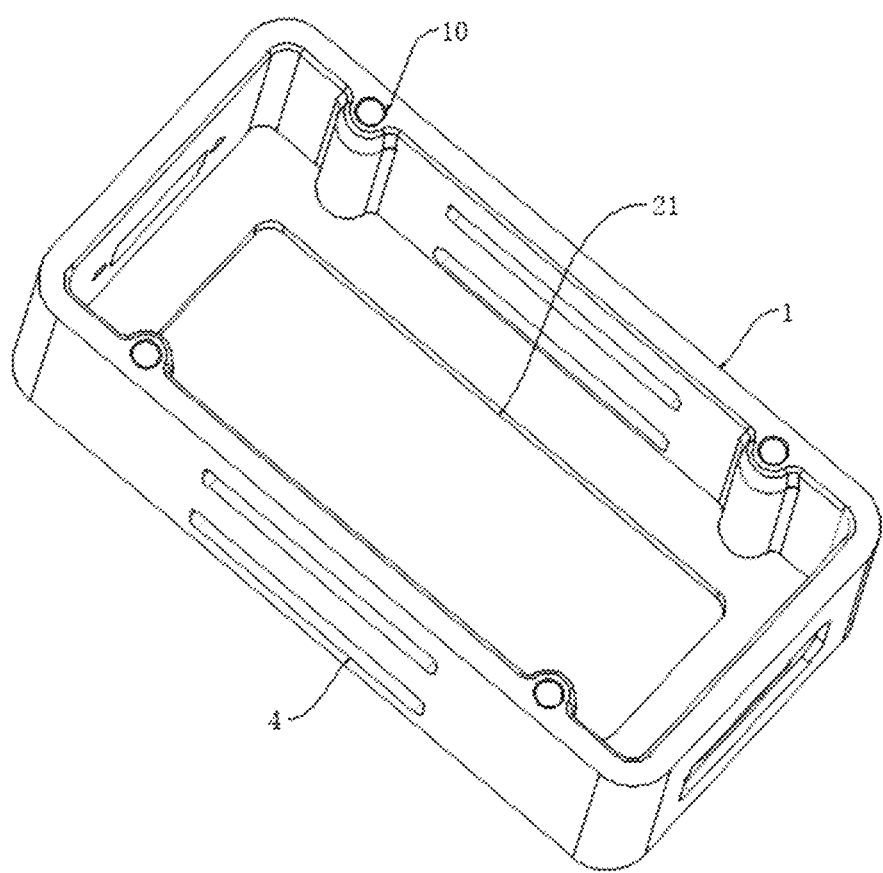
FIG. 6 is a schematic diagram of a structure of a base support in accordance with the present disclosure.

Embodiment: A dynamic wall heat exchange device based on piezoelectric excitation, as shown in FIG. 1 and FIG. 6, comprises a base support 1. The bottom of the base support 1 is provided with a heat dissipation port 21. A sidewall of the base support 1 is provided with a strip-shaped opening 4, and a low-temperature heat source runner 3 is arranged in the strip-shaped opening 4. The number of the low-temperature heat source runners 3 is two, and both sides of each of the low-temperature heat source runners 3 are connected to the inner wall of the strip-shaped opening 4 by vibrating reeds 5.

The base support 1 is provided with a high-temperature heat source runner 2. The high-temperature heat source runners 2 are perpendicular to the low-temperature heat source runner 3. The high-temperature heat source runner 2 comprises a main pipe 201 erected on the base support 1, the main pipe 201 is sleeved with a heat exchange sleeve 6, and the heat exchange sleeve 6 is formed by stacking three types of materials with different controllable heat-conducting coefficients from top to bottom so as to improve the heat exchange effect of the heat exchange sleeve 6. Corrugated pipes 202 are connected to the main pipe 201 in series and are made of engineering temperature-resistant rubber or an aluminum alloy material. The corrugated pipe 202 has a certain crawling effect after being excited by transverse vibration, and has a high fatigue life. The high-temperature heat source runner 2 is perpendicular to the low-temperature heat source runners 3, and the two ends of the high-temperature heat source runner 2 extend out of the base support 1. Both sides of the base support 1 are provided with runner holders 9 in a penetrating manner, the runner holders 9 each comprise a platy portion 901 connected to the base support 1, and the surface of the platy portion 901 is provided with a tubular portion 902. The two ends of the high-temperature heat source runner 2 respectively penetrate through the two tubular portions. The runner holders 9 are provided to limit the high-temperature heat source main runner 2, thus preventing the high-temperature heat source runner 2 from excessive slippage.

The base support 1 is provided with a plurality of elastic cantilever arms 7. The elastic cantilever arm 7 is provided with a preload bolt 11 in a penetrating manner, the upper end of the preload bolt 11 is provided with a preload flat-head knurled nut 8, and the upper side of the elastic cantilever arm 7 is connected to the preload flat-head knurled nut 8 by a preload spring 12. The preload bolt 11, the preload flat-head knurled nut 8 and the preload spring 12 are configured to generate preload pressure, thus preventing the piezoelectric stack 13 from being damaged due to excessive inertial force generated by the inertial mass block 14. The preload pressure of the adjusted by adjusting the preload flat-head knurled nut 8 to make the preload pressure greater than the maximum output force of an excitation system, thus guaranteeing that the piezoelectric stack 13 and the whole device can operate normally without being damaged. The base support 1 is provided with a plurality of mounting holes 10, the cross section of the elastic cantilever arm 7 is of an L-shaped structure, and the elastic cantilever arm 7 is provided with a fixing hole 18 corresponding to the mounting hole 10.

The lower end of the elastic cantilever arm 7 is provided with an inertial mass block 14, a piezoelectric stack 13 is arranged between the elastic cantilever arm 7 and the inertial mass block 14, and the piezoelectric stack 13 is formed by stacking a plurality of circular piezoelectric plates. The lower part of the inertial mass block 14 is provided with an exciting element 15, and the exciting element 15 is arranged above the corrugated pipe 202. An external voltage is applied to the piezoelectric stack 13 to make the piezoelectric stack 13 generate excited vibration. The piezoelectric stack 13 drives the exciting element 15 to vibrate, the exciting force is transferred by the exciting element 15 to the corrugated pipe 202 of the main pipe to make the wall of the corrugated pipe 202 vibrate. The corrugated pipes 202 may generate tiny deformation during vibration, thus making the fluid between the corrugated pipes 202 stay longer in the heat exchange sleeve 6 to achieve sufficient heat exchange of the heat in the heat exchange sleeve 6 and promote the molecular resonance of the fluid to enhance the heat exchange. The exciting element 15 is connected to the inertial mass block 14 by a fixing bolt 16, the lower end of the exciting element 15 is provided with a skewed tooth 151, the skewed tooth 151 of the exciting element 15 is in contact with the corrugated pipe 202. When the exciting element 15 vibrates, the corrugated pipe 202 is compressed by the skewed tooth 151 to drive the corrugated pipe 202 to crawl back and forth, thus further improving the staying time of the fluid between the corrugated pipes 202 in the heat exchange sleeve 6.

The inertial mass block 14 is internally provided with a hexagon bolt countersink 20, and a cap nut of the preload bolt 11 is located in the hexagon bolt countersink 20. The upper surface of the inertial mass block 14 is provided with a piezoelectric stack countersink 17, the piezoelectric stack countersink 17 communicates with the hexagon bolt countersink 20 by a connecting hole 19, and the lower end of the piezoelectric stack 13 is located in the piezoelectric stack countersink 17.

The operating principle is as follows: The present disclosure is applied to an element or equipment which needs efficient heat exchange and has various heat source components, scattered layout, high heat flux density and large temperature difference span in operating conditions. During use, the device is placed on the wall needing heat exchange. Sinusoidal excitation voltages with different frequencies and amplitudes are applied to the piezoelectric stacks 13 according to the heat exchange performance required in use, and signals are amplified by a high-voltage amplifier to generate different excited vibrations, thus driving the inertial mass blocks 14 to vibrate up and down. Then, the exciting force is applied to the corrugated pipes 202 by the exciting elements 15 on the inertial mass blocks 14. The corrugated pipes 202 crawl transversely under repeated compression of the lower inclined planes of the exciting elements 15, thus the fluid between the two crawling corrugated pipes 202 may stay in the heat exchange sleeve 6 for a longer time to achieve sufficient heat exchange among materials with different thermal conductivity. Moreover, the high-frequency vibrations of the exciting elements 15 also make the corrugated pipes 202 vibrate, thus the main pipe 201 is vibrated by the exciting elements 15 under the exciting voltage, and meanwhile, the heat exchange sleeve 6 is driven to vibrate, thereby promoting the molecular resonance of the fluid in the heat exchange sleeve 6 and enhancing heat exchange.

What is claimed is:

1. A dynamic wall heat exchange device based on piezoelectric excitation, comprising a base support (1), wherein a sidewall of the base support (1) is provided with a strip-shaped opening (4), and a low-temperature heat source runner (3) is arranged in the strip-shaped opening (4); the base support (1) is further provided with a high-temperature heat source runner (2); the high-temperature heat source runner (2) comprises a main pipe (201) erected on the base support (1); the main pipe (201) is sleeved with a heat exchange sleeve (6), and corrugated pipes (202) are connected to the main pipe (201) in series and are arranged on both sides of the heat exchange sleeve (6); and the low-temperature heat source runner (3) also penetrates through the heat exchange sleeve (6);

the base support (1) is provided with a plurality of elastic cantilever arms (7), the lower end of each of the elastic cantilever arms (7) is provided with an inertial mass block (14), and a piezoelectric stack (13) is arranged between the elastic cantilever arm (7) and the inertial mass block (14); the lower portion of the inertial mass block (14) is provided with an exciting element (15), and the exciting element (15) is arranged above the corrugated pipe (202); external voltages are applied to the piezoelectric stacks (13) to enable the piezoelectric stacks (13) to generate excited vibrations; the piezoelectric stacks (13) drive the exciting elements (15) to vibrate, the exciting force is transferred by the exciting elements (15) to the corrugated pipes (202) of the main pipe to enable the walls of the corrugated pipes (202) to vibrate; and the corrugated pipes (202) are able to generate tiny deformation during vibration, thus enabling a fluid between the corrugated pipes (202) to stay longer in the heat exchange sleeve (6) to achieve sufficient heat exchange of the heat in the heat exchange sleeve (6).

2. The dynamic wall heat exchange device based on piezoelectric excitation according to claim 1, wherein the elastic cantilever arm (7) is provided with a preload bolt (11) in a penetrating manner, the upper end of the preload bolt (11) is provided with a preload flat-head knurled nut (8), and the upper side of the elastic cantilever arm (7) is connected to the preload flat-head knurled nut (8) by a preload spring (12).

3. The dynamic wall heat exchange device based on piezoelectric excitation according to claim 1, wherein each of the exciting elements (15) is connected to the inertial mass block (14) by a fixing bolt (16), the lower end of the exciting element (15) is provided with a skewed tooth (151), the skewed tooth (151) of the exciting element (15) is in contact with the corrugated pipe (202); and when the exciting elements (15) vibrate, the corrugated pipes (202) are compressed by the skewed teeth (151) to drive the corrugated pipes (202) to crawl back and forth, further increasing the staying time of the fluid between the corrugated pipes (202) in the heat exchange sleeve (6).

4. The dynamic wall heat exchange device based on piezoelectric excitation according to claim 1, wherein the heat exchange sleeve (6) is formed by stacking three types of materials with different controllable heat-conducting coefficients from top to bottom.

5. The dynamic wall heat exchange device based on piezoelectric excitation according to claim 1, wherein the number of the low-temperature heat source runners (3) is two, both sides of each of the low-temperature heat source runners (3) are connected to the inner walls of the strip-shaped openings (4) by vibrating reeds (5); and the high-temperature heat source runner (2) is perpendicular to the low-temperature heat source runners (3).

6. The dynamic wall heat exchange device based on piezoelectric excitation according to claim 1, wherein both sides of the base support (1) are provided with runner holders (9) in a penetrating manner; the runner holders (9) each comprise a platy portion (901) connected to the base support (1), the surface of the platy portion (901) is provided with a tubular portion (902); and the two ends of the high-temperature heat source runner (2) respectively penetrate through the two tubular portions (902).

7. The dynamic wall heat exchange device based on piezoelectric excitation according to claim 1, wherein the base support (1) is provided with a plurality of mounting holes (10); the cross section of the elastic cantilever arm (7) is of an L-shaped structure, and the elastic cantilever arm (7) is provided with a fixing hole (18) corresponding to the mounting hole (10).

8. The dynamic wall heat exchange device based on piezoelectric excitation according to claim 1, wherein the piezoelectric stack (13) is formed by stacking a plurality of circular piezoelectric plates.

9. The dynamic wall heat exchange device based on piezoelectric excitation according to claim 1, wherein the inertial mass block (14) is internally provided with a hexagon bolt countersink (20), a cap nut of the preload bolt (11) is located in the hexagon bolt countersink (20), the upper surface of the inertial mass block (14) is provided with a piezoelectric stack countersink (17), the piezoelectric stack countersink (17) communicates with the hexagon bolt countersink (20) by a connecting hole (19), and the lower end of the piezoelectric stack (13) is located in the piezoelectric stack countersink (17).

10. The dynamic wall heat exchange device based on piezoelectric excitation according to claim 1, wherein the bottom of the base support (1) is provided with a heat dissipation port (21).

11. The dynamic wall heat exchange device based on piezoelectric excitation according to claim 2, wherein the bottom of the base support (1) is provided with a heat dissipation port (21).

12. The dynamic wall heat exchange device based on piezoelectric excitation according to claim 3, wherein the bottom of the base support (1) is provided with a heat dissipation port (21).

13. The dynamic wall heat exchange device based on piezoelectric excitation according to claim 4, wherein the bottom of the base support (1) is provided with a heat dissipation port (21).

14. The dynamic wall heat exchange device based on piezoelectric excitation according to claim 5, wherein the bottom of the base support (1) is provided with a heat dissipation port (21).

15. The dynamic wall heat exchange device based on piezoelectric excitation according to claim 6, wherein the bottom of the base support (1) is provided with a heat dissipation port (21).

16. The dynamic wall heat exchange device based on piezoelectric excitation according to claim 7, wherein the bottom of the base support (1) is provided with a heat dissipation port (21).

17. The dynamic wall heat exchange device based on piezoelectric excitation according to claim 8, wherein the bottom of the base support (1) is provided with a heat dissipation port (21).

18. The dynamic wall heat exchange device based on piezoelectric excitation according to claim 9, wherein the bottom of the base support (1) is provided with a heat dissipation port (21).

* * * * *